United States Patent
Day et al.

(10) Patent No.: US 10,177,717 B2
(45) Date of Patent: Jan. 8, 2019

(54) ACTIVE LINEARIZATION FOR BROADBAND AMPLIFIERS

(71) Applicant: Analog Devices, Inc., Norwood, MA (US)

(72) Inventors: Chris J. Day, Santa Rosa, CA (US); David Frank, Santa Rosa, CA (US); Michael Glasbrener, Santa Rosa, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/457,431

(22) Filed: Mar. 13, 2017

(65) Prior Publication Data

US 2017/0264252 A1    Sep. 14, 2017

Related U.S. Application Data

(60) Provisional application No. 62/308,084, filed on Mar. 14, 2016.

(51) Int. Cl.
   *H03F 1/32*    (2006.01)
   *H03F 3/195*   (2006.01)
   (Continued)

(52) U.S. Cl.
   CPC .............. *H03F 1/3211* (2013.01); *H03F 1/34* (2013.01); *H03F 1/42* (2013.01); *H03F 3/19* (2013.01);
   (Continued)

(58) Field of Classification Search
   CPC .................................................. H03F 1/3211
   (Continued)

(56) References Cited

U.S. PATENT DOCUMENTS

| 4,638,260 A | 1/1987 | Hamley |
| 5,012,199 A | 4/1991 | McKale |

(Continued)

FOREIGN PATENT DOCUMENTS

| CN | 103326682 A | 9/2013 |
| WO | WO-9945637 A1 | 9/1999 |

(Continued)

OTHER PUBLICATIONS

Meyer, Robert G., et al., "A 4-Terminal Wide-Band Monolithic Amplifier", IEEE Journal of Solid-State Circuits, vol. SC-16, No. 6, (Dec. 1981), 634-638.

(Continued)

*Primary Examiner* — Patricia T Nguyen
(74) *Attorney, Agent, or Firm* — Schwegman Lundberg & Woessner, P.A.

(57) ABSTRACT

For broadband data communication, a data signal voltage at a signal input node can be converted to an output signal current at a signal output node. A first transistor device can contribute to the output signal current, with its transconductance or other gain reduced to accommodate larger signal swings, at which a second transistor can turn on and increase an effective resistance value of at least a portion of a gain degeneration resistor associated with the first transistor device. The second transistor can also contribute to the output signal current to help maintain or enhance an overall gain between the signal input node and the signal output node. Multiple secondary stages, push-pull arrangements, buffer amplifier configurations (which may or may not contribute to current in the gain degeneration resistor), input and output transformers, negative feedback to help reduce component variability, and frequency modification circuits or components are also described.

26 Claims, 16 Drawing Sheets

Active degeneration

(51) Int. Cl.
  *H03F 3/24*   (2006.01)
  *H03F 3/45*   (2006.01)
  *H03F 1/34*   (2006.01)
  *H03F 1/42*   (2006.01)
  *H03F 3/19*   (2006.01)
  *H03F 3/26*   (2006.01)

(52) U.S. Cl.
  CPC ............ *H03F 3/195* (2013.01); *H03F 3/245* (2013.01); *H03F 3/26* (2013.01); *H03F 3/4508* (2013.01); *H03F 3/45278* (2013.01); *H03F 3/45488* (2013.01); *H03F 2200/09* (2013.01); *H03F 2200/411* (2013.01); *H03F 2200/451* (2013.01); *H03F 2200/534* (2013.01); *H03F 2200/541* (2013.01); *H03F 2200/63* (2013.01); *H03F 2203/45324* (2013.01); *H03F 2203/45352* (2013.01); *H03F 2203/45392* (2013.01); *H03F 2203/45394* (2013.01); *H03F 2203/45612* (2013.01)

(58) Field of Classification Search
  USPC ........................................................ 330/258
  See application file for complete search history.

(56) References Cited

U.S. PATENT DOCUMENTS

| | | | |
|---|---|---|---|
| 5,216,379 A | 6/1993 | Hamley | |
| 5,477,188 A | 12/1995 | Chawla | |
| 5,559,469 A | 9/1996 | Smith | |
| 5,793,252 A | 8/1998 | Smith | |
| 5,880,632 A | 3/1999 | Yamasita | |
| 6,615,028 B1 | 9/2003 | Loke et al. | |
| 6,782,244 B2 | 8/2004 | Steel et al. | |
| 6,804,500 B2 | 10/2004 | Yamaguchi | |
| 7,091,788 B2 | 8/2006 | Glass | |
| 7,728,661 B2 | 6/2010 | Bocjelman et al. | |
| 7,768,350 B2 | 8/2010 | Srinivasan et al. | |
| 7,936,215 B2 | 5/2011 | Lee et al. | |
| 8,031,003 B2 | 10/2011 | Dishop | |
| 8,130,039 B2 | 3/2012 | Dishop | |
| 8,149,064 B2 | 4/2012 | Paul et al. | |
| 8,198,968 B2 | 6/2012 | Oliaei et al. | |
| 8,666,340 B2 | 3/2014 | Rofougaran et al. | |
| 8,718,580 B2 | 5/2014 | Borodulin et al. | |
| 2013/0257537 A1 | 10/2013 | Mourant et al. | |
| 2016/0072460 A1 | 3/2016 | Tatsumi | |

FOREIGN PATENT DOCUMENTS

| | | |
|---|---|---|
| WO | 2010045597 | 4/2010 |
| WO | 2017160747 | 9/2017 |

OTHER PUBLICATIONS

Meyer, Robert G., et al., "A Wide-Band Ultralinear Amplifier from 3 to 300 MHz", IEEE Journal of Solid-State Circuits, vol. SC-9, No. 4; (Aug. 1974), 167-175.

Paidi, Vamsi, et at, "High Linearity and High Efficiency of Class-B Power Amplifiers in GaN HEMT Technology", IEEE Transactions on Microwave Theory and Techniques, vol. 51, No. 2, (Feb. 2003), 643-652.

Solomon, J. E., et al., "A Highly Desensitized, Wide-Band Monolithic Amplifier", IEEE Journal of Solid-State Circuits, vol. SC-1, No. 1., (Sep. 1966), 19-28.

Tanimoto, Hiroshi, et al., "Realization of a 1-V Active Filter Using a Linearization Technique Employing Plurality of Emitter-Coupled Pairs", IEEE Journal of Solid-State Circuits, vol. 26, No. 7, (Jul. 1991), 937-945.

"International Application Serial No. PCT/US2017/022145, International Search Report dated May 31, 2017", 4 pgs.

"International Application Serial No. PCT/US2017/022145, Written Opinion dated May 31, 2017", 7 pgs.

"International Application Serial No. PCT/US2018/015255, International Search Report dated May 13, 2018", 4 pgs.

"International Application Serial No. PCT/US2018/015255, Written Opinion dated May 13, 2018", 4 pgs.

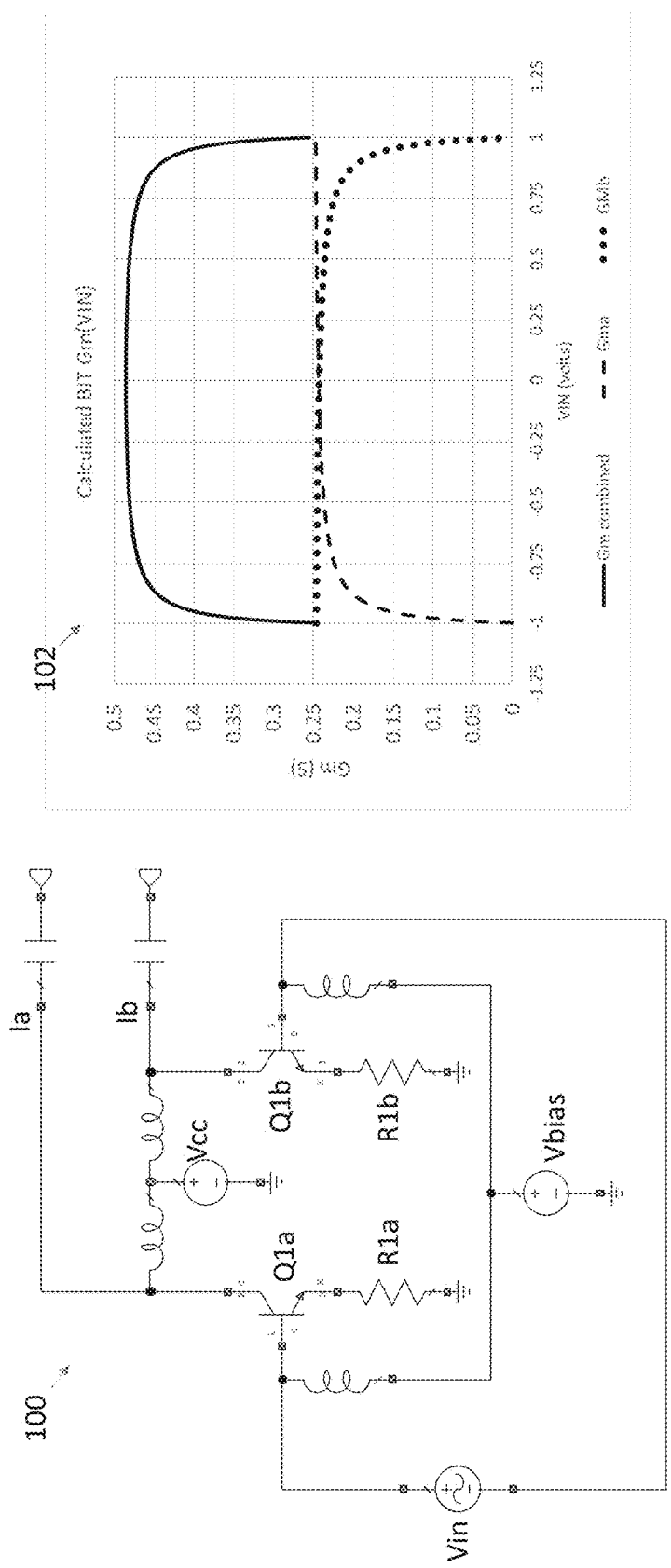
FIG. 1 Two bipolar stages operated differentially

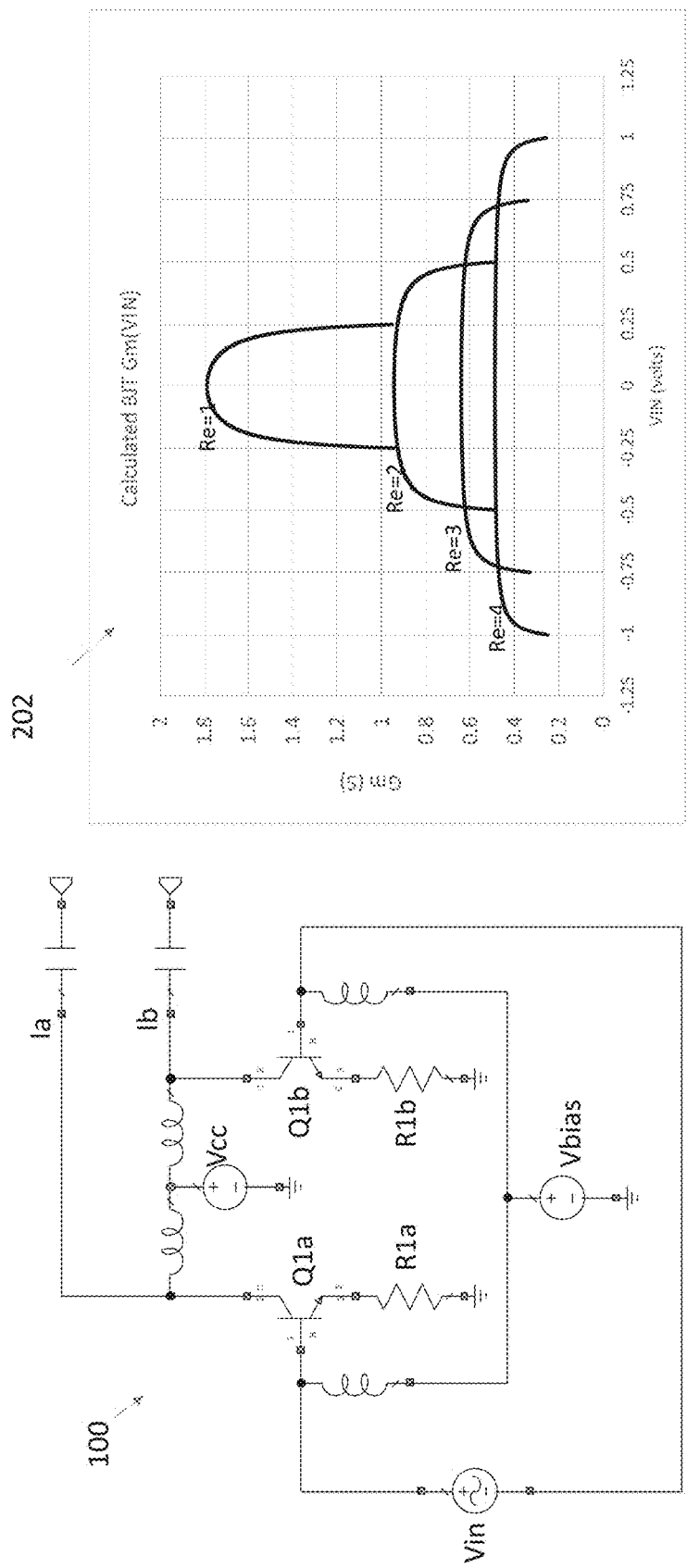
FIG. 2 Effect of varying degeneration

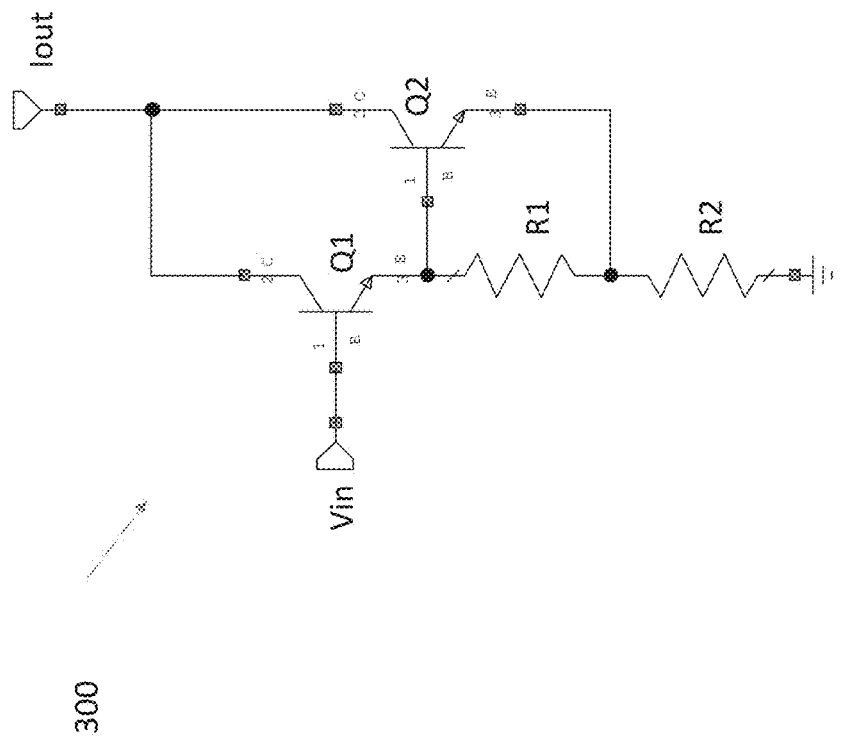
FIG. 3 Active degeneration

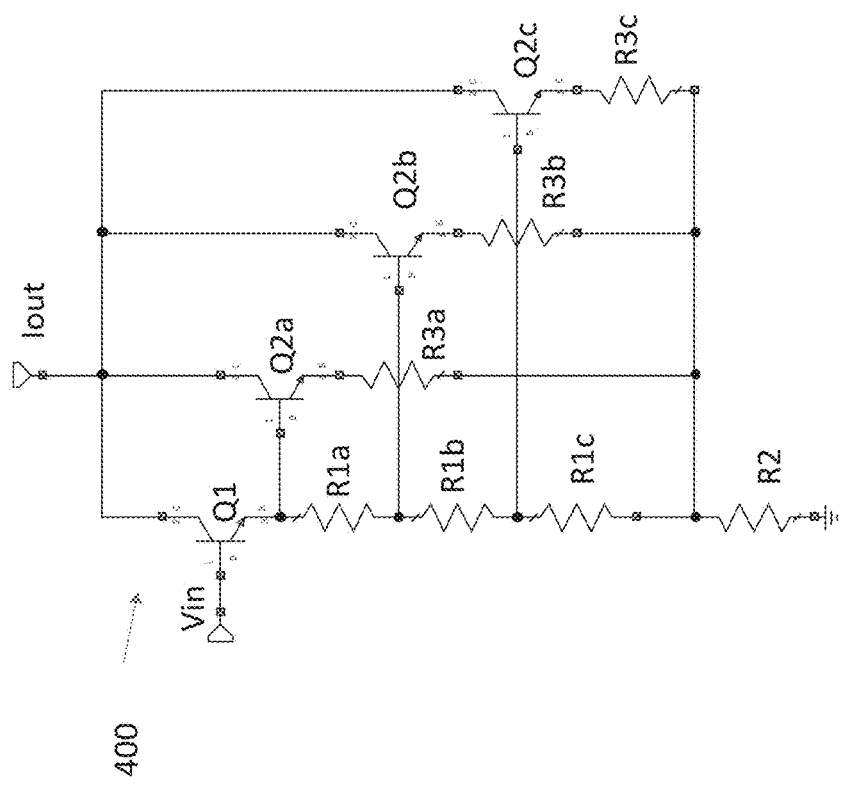
FIG. 4 Extended active degeneration

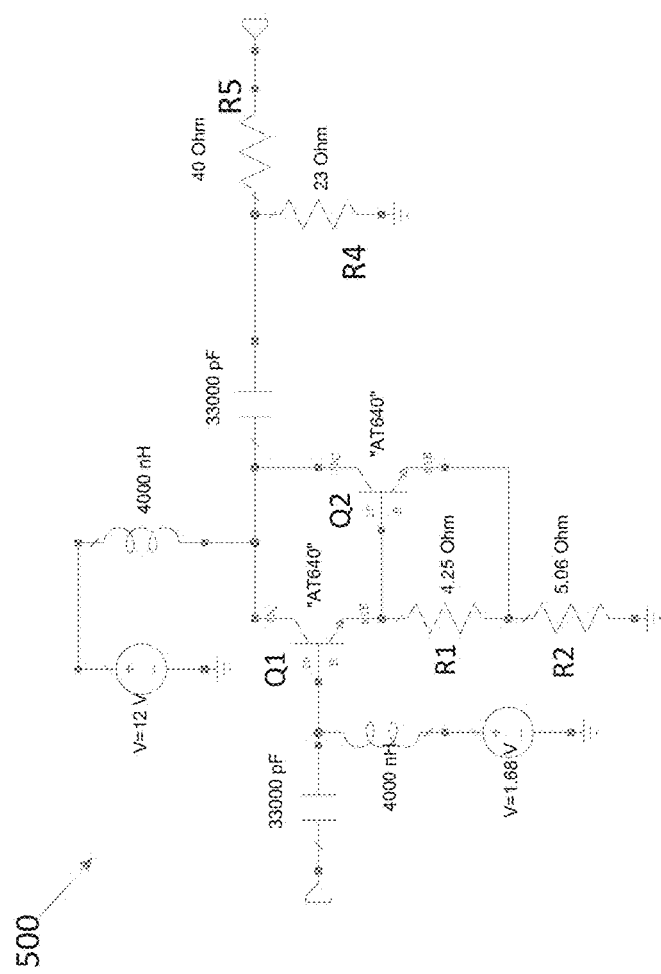
FIG. 5 Active degeneration example

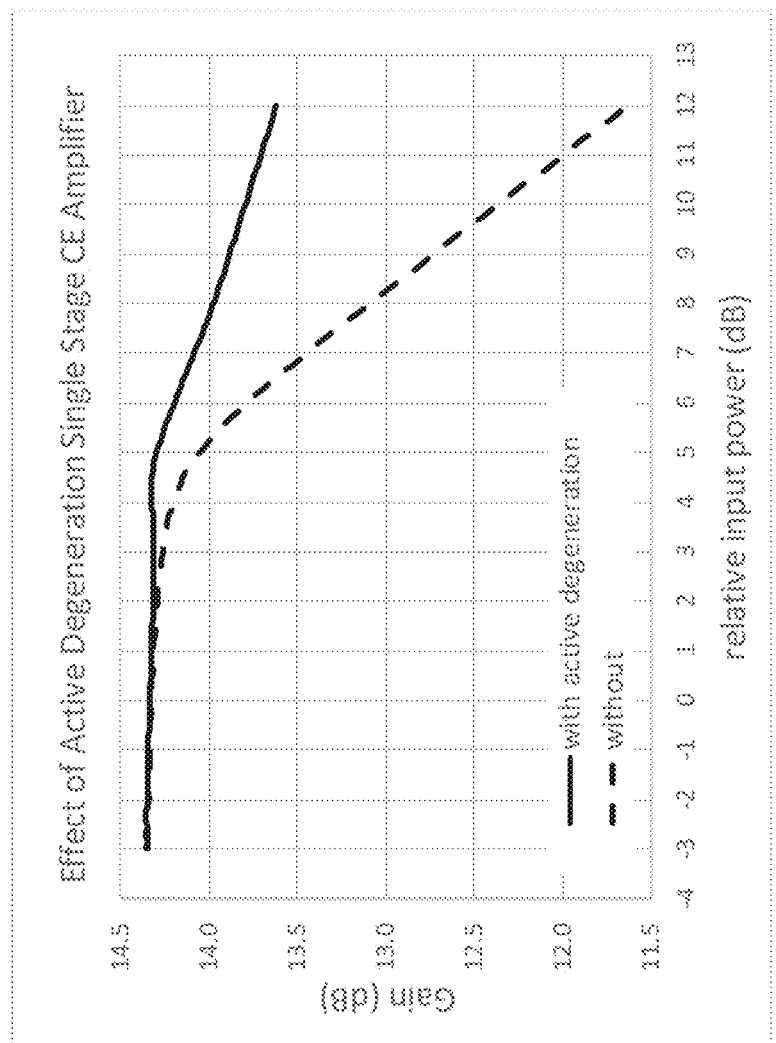
FIG. 6 Active degeneration measurement

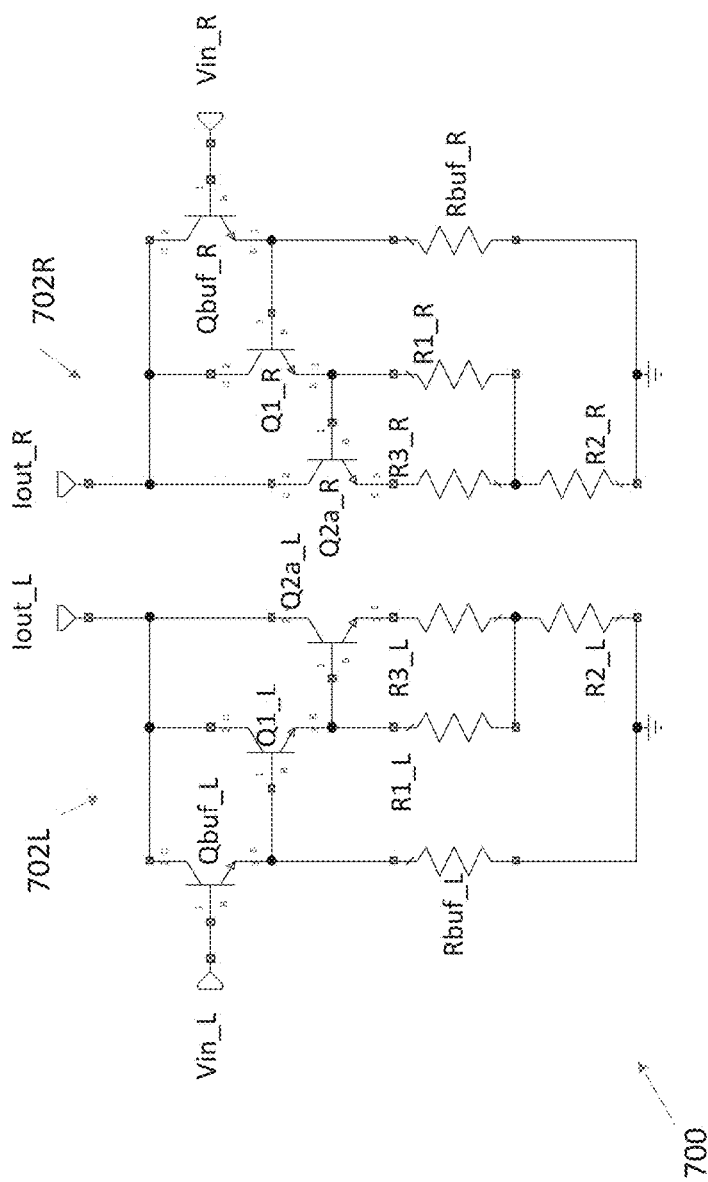
FIG. 7 Active degeneration applied to gain compensation in circuit with right and left halves

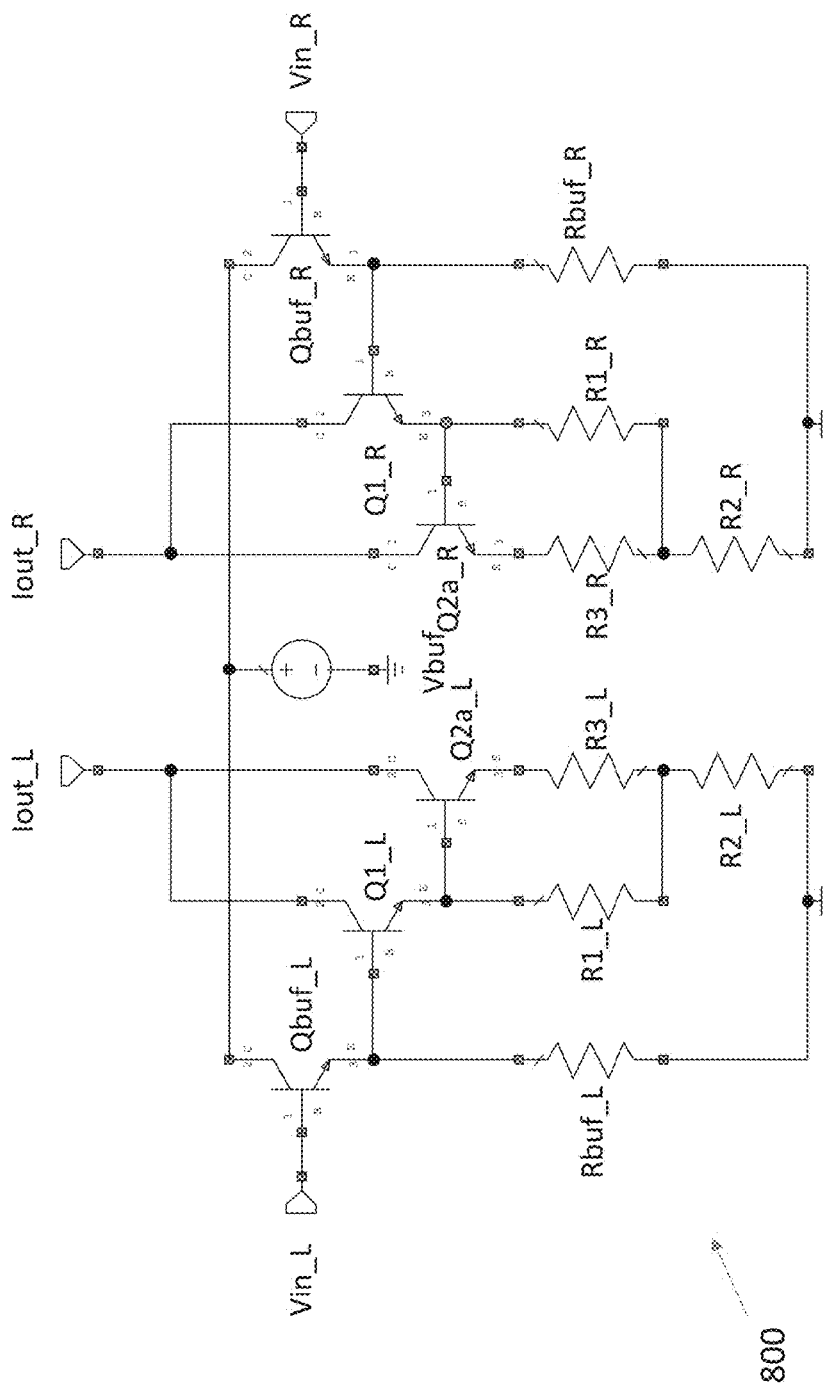
FIG. 8 Differential Active degeneration with buffer devices separately biased

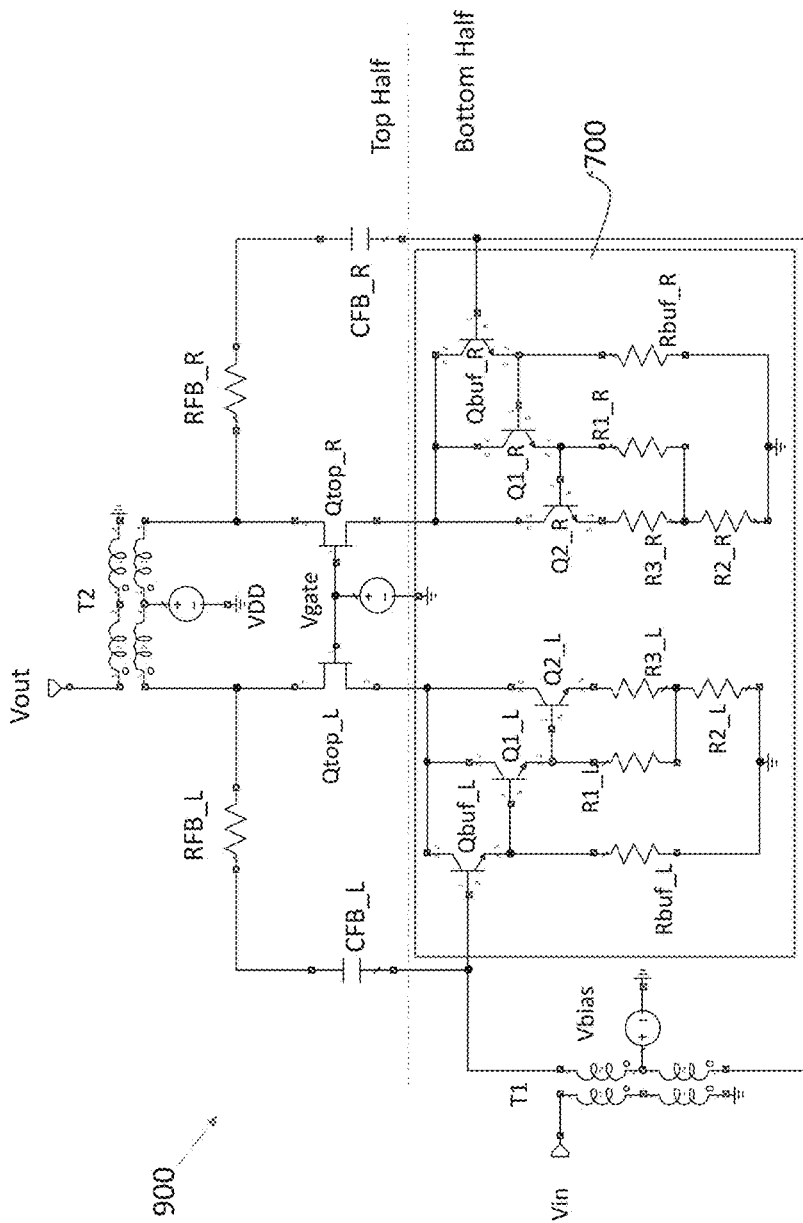
FIG. 9 Differential Active degeneration applied to broadband amplifier

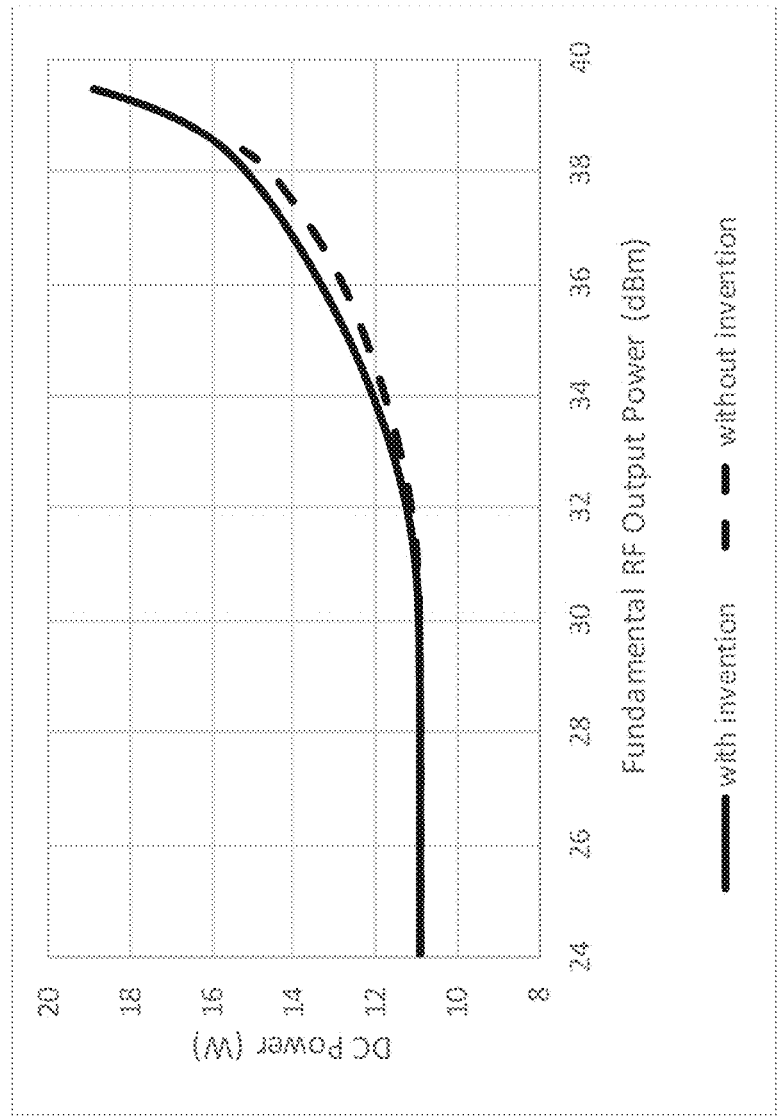
FIG. 10 Power consumption with and without invention

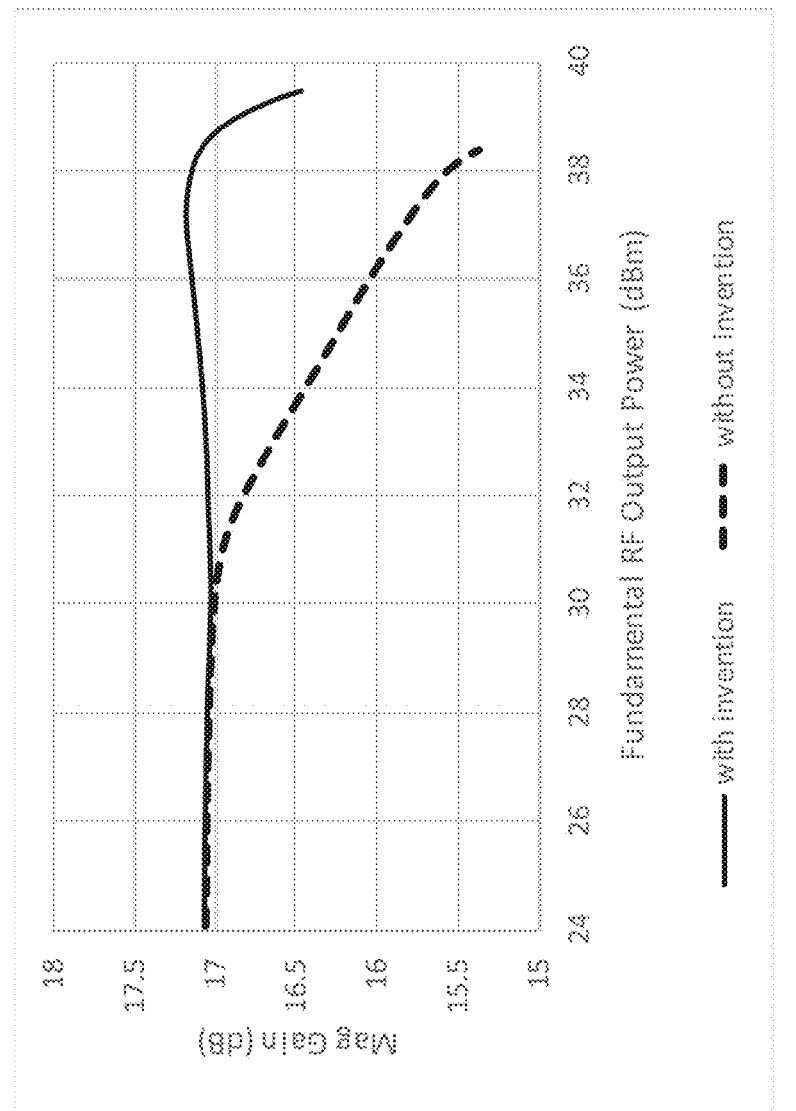
FIG. 11 Magnitude Gain Responses with and without invention

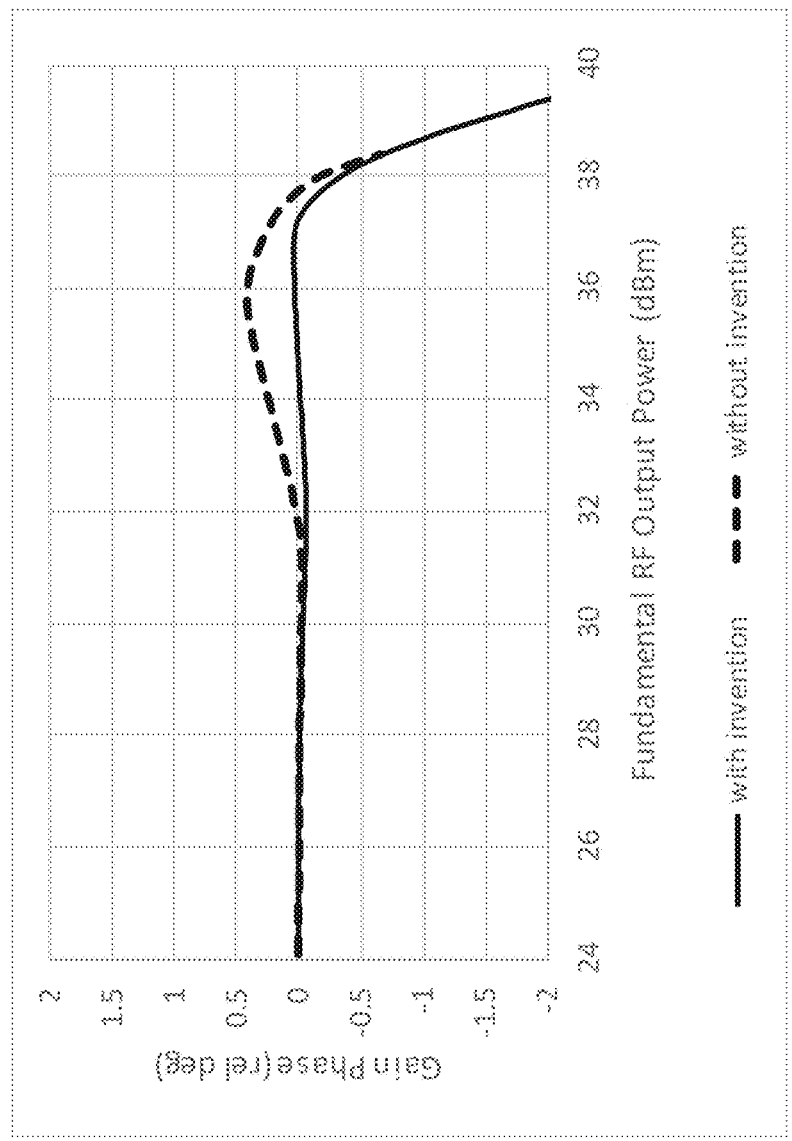
FIG. 12 Phase Gain Responses with and without invention

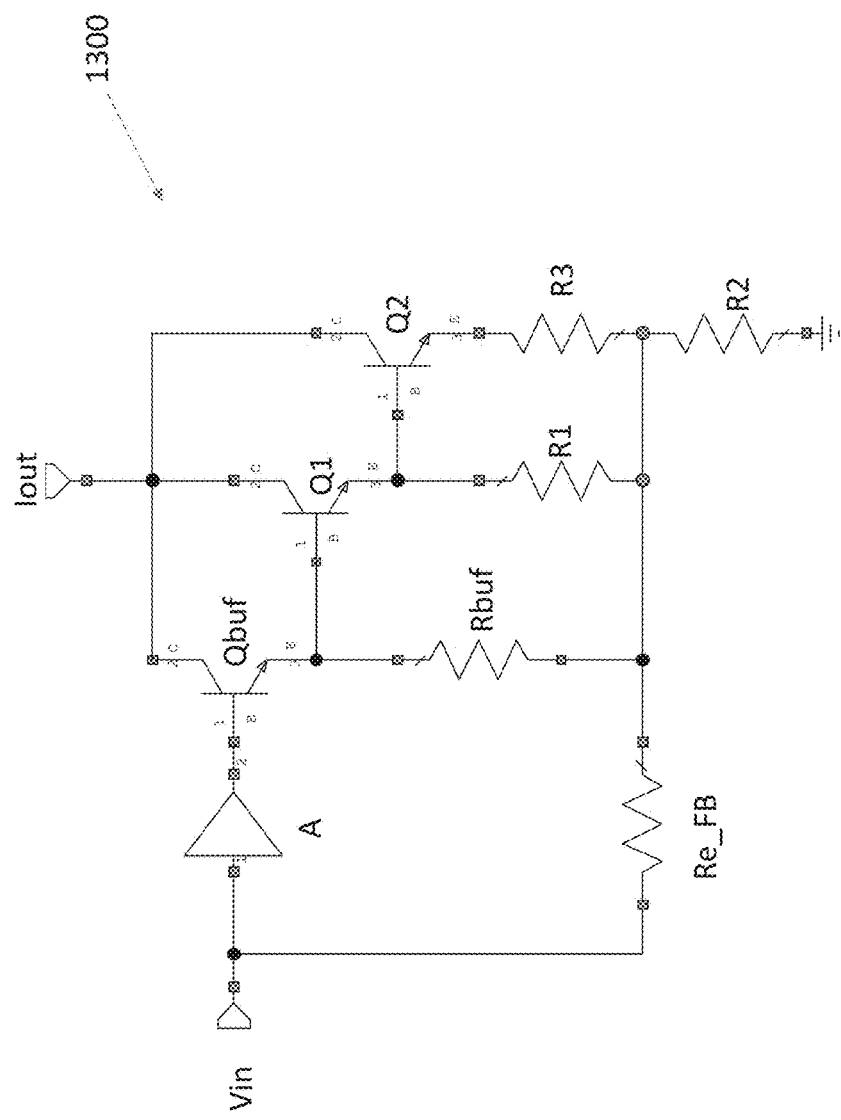
FIG. 13 Active degeneration with increased loop gain feedback

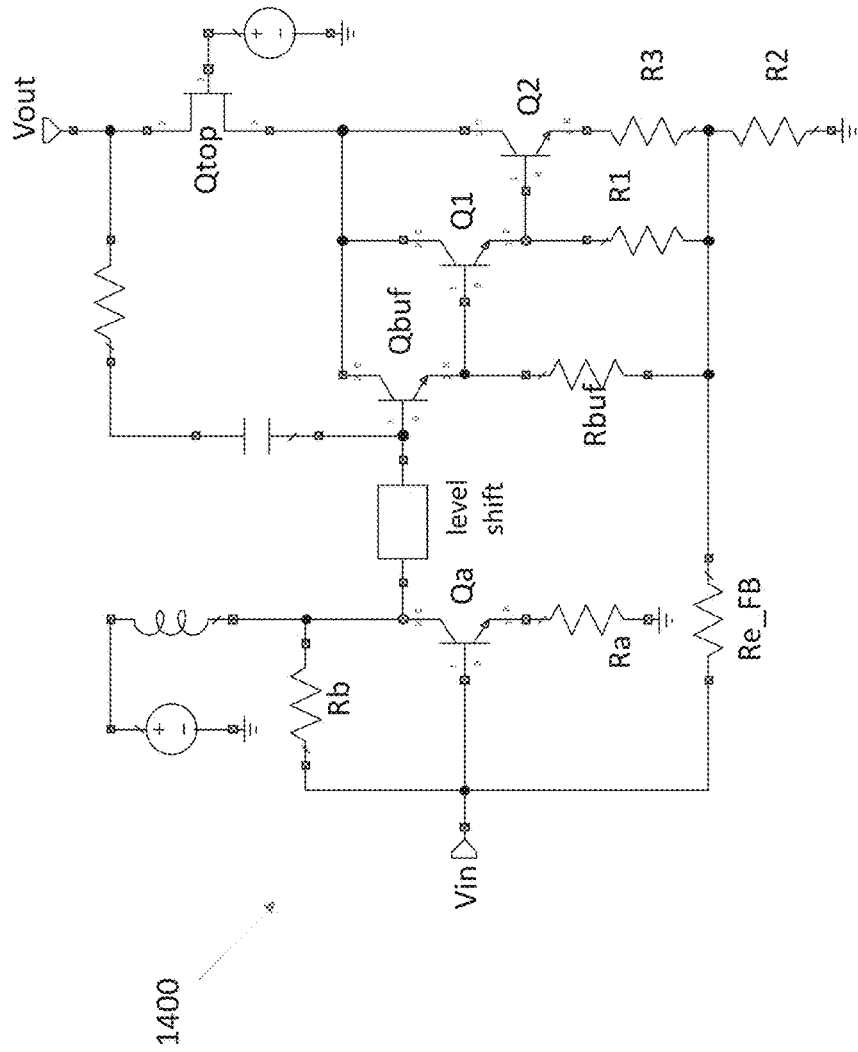
FIG. 14 Active degeneration with enhanced loop gain feedback

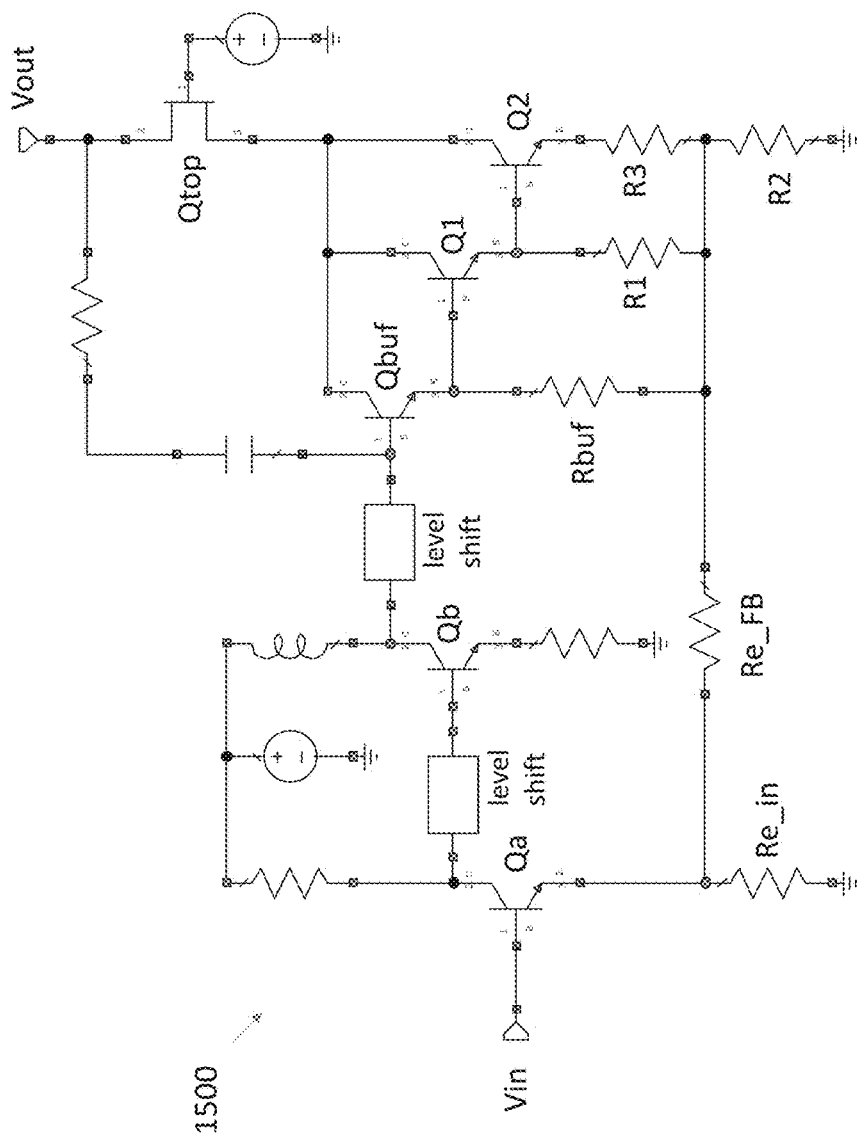
FIG. 15 Active degeneration with triplet feedback loop

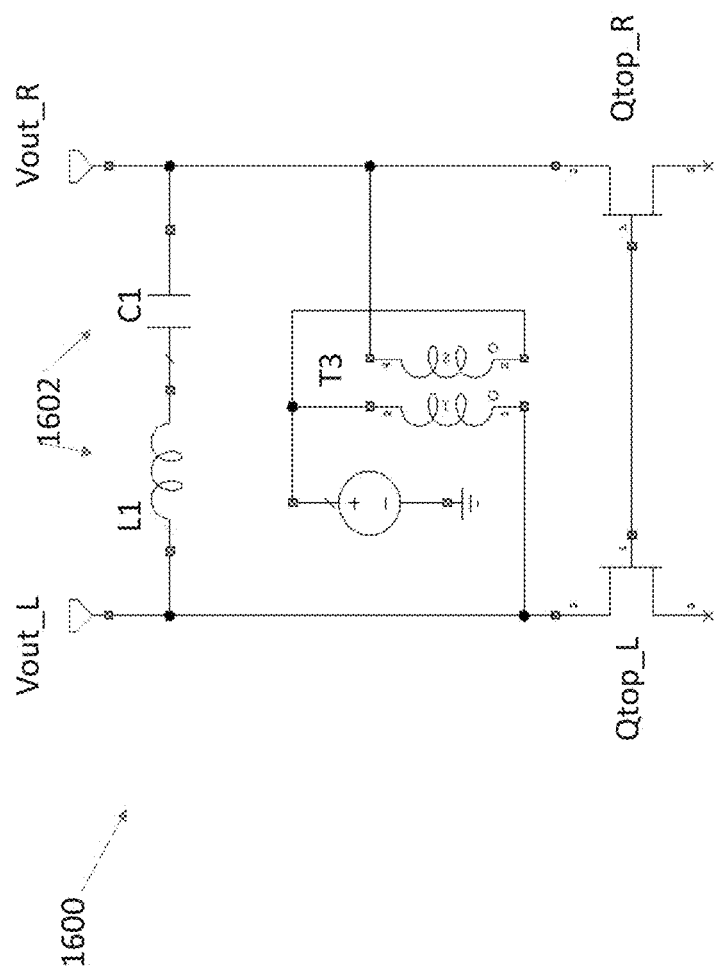
FIG. 16 2nd harmonic traps on outputs

ACTIVE LINEARIZATION FOR BROADBAND AMPLIFIERS

CLAIM OF PRIORITY

This patent application claims the benefit of priority of Chris J. Day et al. U.S. Provisional Patent Application No. 62/308,084, entitled ACTIVE LINEARIZATION FOR BROADBAND AMPLIFIERS, which was filed on 14 Mar. 2016, and which is hereby incorporated herein by reference in its entirety.

TECHNICAL FIELD

This document pertains generally, but not by way of limitation, to integrated circuits, and more particularly, to amplifiers such as for cable television (CATV) or other broadband communications.

BACKGROUND

As broadband communications systems emerge, the need for power efficient data transmission is becoming important, particularly as operators try to reduce capital and operating expenses. For example, in cable television systems that rely on Class A amplifiers for amplifying signals for data transmission, the cost of powering the cable television network can be the largest operating expense. A more power efficient amplifier would, therefore, be highly desirable for cable operators.

Also, consumers of broadband content, such as pay-per-view digital video and popular video streaming services like Netflix, demand increased levels of content available across multiple devices at any time. Hence, the bandwidth requirements on the cable television or other broadband communication network continues to grow. Forecasters see little change in the growth pattern of data consumption.

Meeting this demand can involve turning to advanced methods of encoding signals before transmission over a broadband network. Such modulation techniques can be increasingly sophisticated and can provide impressive leaps in bandwidth efficiency. However, the improved signals can be much harder to amplify.

SUMMARY

The present inventors have recognized, among other things, a need for improved amplifiers such as for cable television or other broadband. communications, such as can accommodate such advanced methods of encoding or modulating signals before data transmission. Such signals can have very high peak power excursions when compared to their average levels, which can wreak havoc on amplifiers throughout the system. Also, the complex nature of these signals can benefit from an increase in signal fidelity throughout the system, which can be helped using transmission system amplifiers having reduced levels of distortion to achieve good performance. Without low levels of distortion in the system, cable television customers will experience impairments, such as pixelation of their video streams or poor internet throughput performance. The need for low distortion in the system can be magnified with the deployment of the more sophisticated signals and increased amount of such signals placed on the network.

Since distortion performance is important, Class A topology amplifiers are be preferred, because they are often he the most linear amplifier type available. For this reason, CATV networks can be dominated by Class A amplifiers. Class A amplifiers have a theoretical best case efficiency of 50%. Class A amplifiers capable of increased output swings from the new signals will consume more power. This can lead to a major dilemma in the network. While operators may want low distortion for increased bandwidth to serve customers, they may not want the added operating cost and degraded reliability that can come with increased power consumption.

Other classes of amplifiers can provide much higher levels of efficiency, but they generally come at cost of degraded distortion performance. Class AB and Class C topologies, for example, can promise greater than 50% efficiencies but can greatly compromise distortion.

This present patent document describes, among other things, an amplification technique, such as for cable television or other broadband data. communications, that can achieve the linearity of Class A and the efficiency benefits of Class C or Class AB. The present techniques can include novel methods of combining classes of amplifiers while decreasing or minimizing certain distortion issues that can be associated with the higher efficiency topologies. The present techniques can include a blended class approach to concurrently address the distortion and efficiency dilemma that may be currently plaguing the communications market today.

For broadband data communication, a data signal voltage at a signal input node can be converted to an output signal current at a signal output node. A first transistor device can contribute to the output signal current, with its transconductance or other gain reduced to accommodate larger signal swings, at which a second transistor can turn on and increase an effective resistance value of at least a portion of a gain degeneration resistor associated with the first transistor device. The second transistor can also contribute to the output signal current to help maintain or enhance an overall gain between the signal input node and the signal output node. Multiple secondary stages, push-pull arrangements, buffer amplifier configurations (which may or may not contribute to current in the gain degeneration resistor), input and output transformers, negative feedback to help reduce component variability, and frequency modification circuits or components are also described.

A non-limiting overview of certain aspects of the present subject matter follows immediately below.

Aspect 1 can include or use subject matter (such as an apparatus, a system, a device, a method, a means for performing acts, or a device readable medium including instructions that, when performed by the device, can cause the device to perform acts), such as can include or use a power amplifier circuit for broadband data communication over a path in a communication network. The power amplifier circuit can include a first amplifier stage and a second amplifier stage. The first amplifier stage can comprise circuitry including a first transistor. The first transistor can have a signal input node to receive a data signal voltage to be converted by the first transistor into a current to contribute to an output signal current to be provided at a signal output node. The first amplifier stage can also include a first gain degeneration resistor, coupled to the first transistor and configured to receive a representation of a component of the output signal current provided by the first transistor. The second amplifier stage can comprise circuitry including a second transistor, coupled to the first transistor to receive an input voltage based on the data signal voltage. The second transistor can be configured to turn on at a larger amplitude of the data signal voltage relative to a smaller amplitude of the data signal voltage, such as to (1) to provide current to at least a portion of the first gain degeneration resistor to reduce a transconductance or other gain of the first transistor; and (2) contribute current to the output signal current to help maintain or enhance an overall gain between the signal input node and the signal output node.

Aspect 2 can include or use, or can optionally be combined with the subject matter of Aspect 1 to optionally include or use the first gain degeneration resistor including a first resistance component, arranged to provide a control voltage to turn on the second transistor. A second resistance component can be arranged to receive current from the second transistor to increase an effective resistance of the second resistance component to reduce the gain of the first transistor.

Aspect 3 can include or use, or can optionally be combined with the subject matter of one or any combination of Aspects 1 or 2 to optionally include or use N second amplifier stages respectively including a corresponding second transistor, wherein N is an integer greater than or equal to two, and wherein the first gain degeneration resistor includes: N first resistance components, providing respective control voltages to turn on the corresponding second transistor of a respective one of the N second amplifier stages; and wherein the second resistance component is arranged to receive current from at least two of the second transistors of corresponding second amplifier stages.

Aspect 4 can include or use, or can optionally be combined with the subject matter of one or any combination of Aspects 1 through 3 to optionally include or use the second resistance component being arranged to receive current from at least two of the second transistors of corresponding second amplifier stages via respective resistors having resistance values for operating respective second transistors in the corresponding second amplifier stages for contributing respective currents to the output signal current to help maintain or enhance an overall gain between the signal input node and the signal output node.

Aspect 5 can include or use, or can optionally be combined with the subject matter of one or any combination of Aspects 1 through 4 to optionally include or use the first amplifier stage being preceded by a buffer circuit stage in the signal path to receive a pre-buffered data signal voltage and to provide a resulting buffered data signal voltage as the data signal voltage at the signal input node of the first amplifier stage.

Aspect 6 can include or use, or can optionally be combined with the subject matter of one or any combination of Aspects 1 through 5 to optionally include or use the buffer circuit stage being arranged to provide a current that does not flow through the first gain degeneration resistor.

Aspect 7 can include or use, or can optionally be combined with the subject matter of one or any combination of Aspects 1 through 5 to optionally include or use the buffer circuit stage being arranged to provide a current that flows through at least a portion of the first gain degeneration resistor.

Aspect 8 can include or use, or can optionally be combined with the subject matter of one or any combination of Aspects 1 through 7 to optionally include or use the buffer circuit stage is connected to a separate biasing circuit so as not contribute to the output signal current at the signal output node.

Aspect 9 can include or use, or can optionally be combined with the subject matter of one or any combination of Aspects 1 through 8 to optionally include or use a dual portion circuit arrangement including an "L" circuit portion and an "R" circuit portion, each including a corresponding first amplifier stage and a corresponding at least one second amplifier stage, and arranged to receive a respective input voltage at respective "L" and "R" ones of the signal input node and to provide a respective signal output at respective "L" and "R" ones of the signal output node.

Aspect 10 can include or use, or can optionally be combined with the subject matter of one or any combination of Aspects 1 through 9 to optionally include or use the first amplifier stage being preceded by a buffer circuit stage in the signal path to receive a pre-buffered data signal voltage and to provide a resulting buffered data signal voltage as the data signal voltage at the signal input node of the first amplifier stage, wherein the buffer circuit stage in the L circuit portion is connected to the buffer circuit stage in the R circuit portion and does not contribute to the output signal current at respective "L" and "R" ones the signal output node.

Aspect 11 can include or use, or can optionally be combined with the subject matter of one or any combination of Aspects 1 through 10 to optionally include or use an input transformer, configured to receive a single-ended input signal and to provide the respective input voltage at the respective L and R ones of the signal input node. An output transformer can be configured to receive the respective signal output at respective L and R ones of the signal output node and to provide a resulting single-ended output signal.

Aspect 12 can include or use, or can optionally be combined with the subject matter of one or any combination of Aspects 1 through 11 to optionally include or use respective field-effect or other transistor cascode devices through which respective output signal currents pass, wherein the cascode devices respectively include a control terminal configured to receive a fixed bias voltage.

Aspect 13 can include or use, or can optionally be combined with the subject matter of one or any combination of Aspects 1 through 12 to optionally include or use a feedback signal taken from the second resistance component, provided with a gain as negative feedback to modify the data signal voltage to be received by the first amplifier stage at the signal input node.

Aspect 14 can include or use, or can optionally be combined with the subject matter of one or any combination of Aspects 1 through 13 to optionally include or use, e.g., across the respective L and R ones of the signal output node, a notch or lowpass frequency-selective filter circuit to attenuate or reject a common-mode signal.

Aspect 15 can include or use, or can optionally be combined with the subject matter of one or any combination of Aspects 1 through 14 to optionally include or use, e.g., across the respective L and R ones of the signal output note, a balun, including a center tap configured to receive a fixed bias voltage.

Aspect 16 can include or use, or can optionally be combined with the subject matter of one or any combination of Aspects 1 through 15 to optionally include or use, an amplifier method for broadband data communication over a path in a communication network. The method can include converting a data signal voltage at a signal input node to an output signal current to be provided at a signal output node, using a first transistor device operable to contribute to the output signal current. The method can also include converting a signal based on the data signal voltage at the signal input node into a current, using a second transistor device, to be provided to reduce a transconductance or other gain of the first transistor, and to contribute to the output signal current to help maintain or enhance an overall gain between the signal input node and the signal output node.

Aspect 17 can include or use, or can optionally be combined with the subject matter of one or any combination of Aspects 1 through 16 to optionally include or use: providing current from the first transistor device to a first resistance component of a first gain degeneration resistor to turn on the second transistor at a larger amplitude of the data signal voltage relative to a smaller amplitude of the data signal voltage; and, providing current from the first transistor device and from the second transistor device to a second component of the first gain degeneration resistor, wherein the providing current from the second transistor device to the second component of the first gain degeneration resistor to increase an effective resistance of the second resistance component to reduce the gain of the first transistor.

Aspect 18 can include or use, or can optionally be combined with the subject matter of one or any combination of Aspects 1 through 17 to optionally include or use: taking a feedback signal from the second resistance component; and, providing the feedback signal with gain as negative feedback to modify the data signal voltage to be received by the first amplifier stage at the signal input node.

Aspect 19 can include or use, or can optionally be combined with the subject matter of one or any combination of Aspects 1 through 18 to optionally include or use: receiving the data signal voltage as a differential or push-pull input signal; providing a resulting differential or push-pull output signal; and attenuating a common-mode component of the output signal.

Aspect 20 can include or use, or can optionally be combined with the subject matter of one or any combination of Aspects 1 through 19 to optionally include or use a power amplifier circuit for broadband data communication over a path in a communication network. The power amplifier circuit can comprise: means for converting a data signal voltage at a signal input node to an output signal current to be provided at a signal output node, using a first transistor device operable to contribute to the output signal current; and means for converting a signal based on the data signal voltage at the signal input node into a current, using a second transistor device, to be provided to reduce a transconductance or other gain of the first transistor, and to contribute to the output signal current to help maintain or enhance an overall gain between the signal input node and the signal output node.

This Summary is intended to provide an outline of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 1 shows a simplified example of portions of a push-pull transconductance Class A power amplifier circuit that can convert a differential input voltage into output currents.

FIG. 2 shows an example of a calculated plot of differential transconductance gain vs. input voltage, for different values of degeneration by the gain degeneration resistors.

FIG. 3 shows an example of providing dynamically varying active gain degeneration in a power amplifier circuit.

FIG. 4 shows an example of providing dynamically varying active gain degeneration in a power amplifier circuit, extending the approach of FIG. 3 by adding transistor devices.

FIG. 5 shows an example of a single-ended, single-stage common emitter (CE) power amplifier circuit in accordance with the principles illustrated by the circuit shown in FIG. 3.

FIG. 6 shows a measurement of gain compression obtained using a power amplifier circuit shown in FIG. 5.

FIG. 7 shows an example of a power amplifier circuit that can be used to provide an extended operating range.

FIG. 8 shows an example of a differential power amplifier circuit that can be modified from the example shown in FIG. 7, such as by biasing buffer devices using a separate supply.

FIG. 9 shows an example of a modified power amplifier circuit such as can be applied in an example of a cable television broadband cascade amplifier configuration.

FIGS. 10, 11, and 12 show examples of computer simulation results of the circuit configuration shown in FIG. 9.

FIG. 13 shows an example of a portion of a power amplifier circuit that can help address variability concerns, such as by including an additional preamplifier circuit stage within a negative feedback loop.

FIG. 14 shows an example of a possible circuit configuration that can be used to implement the feedback circuit principles shown in and described with respect to FIG. 13.

FIG. 15 shows an example of another possible circuit implementation such as can use a similar high loop gain principle, such as can help to mitigate otherwise possible misalignment of the active gain degeneration or to further reduce the distortion in the circuit.

FIG. 16 shows and example of an even-mode harmonic filter or trap circuit, which can be included in or used in combination with one or any of the single-ended or push-pull power amplifier circuit configurations shown or described.

DETAILED DESCRIPTION

This present patent document describes, among other things, an amplification technique, such as for cable television or other broadband data communications, that can achieve the linearity of Class A and the efficiency benefits of Class C or Class AB. The present techniques can include novel methods of combining classes of amplifiers while decreasing or minimizing certain distortion issues that can be associated with the higher efficiency topologies. The present techniques can include a blended class approach to concurrently address the distortion and efficiency dilemma that may be currently plaguing the communications market today.

Certain amplifiers that can be used in low distortion networks can be differential in nature. This can include, for example, two amplifiers operated out of phase, or can include a single differential amplifier. A well-balanced differential amplifier can nullify even-order distortion terms. For broadband data communication, a data signal voltage at a signal input node can be converted to an output signal current at a signal output node. A first transistor device can contribute to the output signal current, with its transconductance or other gain reduced to accommodate larger signal swings, at which a second transistor can turn on and increase an effective resistance value of at least a portion of a gain degeneration resistor associated with the first transistor device. The second transistor can also contribute to the output signal current to help maintain or enhance an overall gain between the signal input node and the signal output node. Multiple secondary stages, push-pull arrangements, butler amplifier configurations (which may or may not contribute to current in the gain degeneration resistor), input and output transformers, negative feedback to help reduce component variability, and frequency modification circuits or components are also described.

FIG. 1 shows a simplified example of portions of a push-pull transconductance Class A power amplifier circuit 100 that can convert a differential input voltage, Vin, received at amplifier input terminals of transistors Q1a and Q1b, into two out-of-phase output currents, Ia and Ib, which can be provided to respective differential electrical communication lines of the cable television or other broadband communication networks, such as for communication to a receiver at another location in the communication network. The transconductance gain for each half of the differential transconductance amplifier circuit is GMa and GMb, respectively, and the combined transconductance is the sum of GMa with GMb, with the transconductances being based on the native transconductances provided by the transistors Q1a and Q1b, such as shown in the calculated transconductance (Gm, in Siemens) vs. input voltage (Vin, in Volts) plot 102 shown in FIG. 1.

FIG. 1 also shows the collectors of the transistors Q1a and Q1b being inductively coupled to a supply or other bias voltage, such as Vcc, and the bases of the transistors Q1a and Q1b being inductively coupled to a separate bias voltage, such as Vbias. The emitters of the transistors Q1a and Q1b can be resistively coupled to a reference voltage, such as a ground voltage, such as by gain degeneration resistors R1a and R1b, which can serve to linearize the native transconductances of the bipolar transistors, Q1a and Q1b.

FIG. 2 shows an example of a calculated plot 202 of differential transconductance (Gm, in Siemens) gain vs. input voltage (Vin, in Volts) for the power amplifier circuit 100, for different values of degeneration by the gain degeneration resistors R1a and R1b, as the input differential voltage Vin is varied. For this example of the plot 202, the total bias current of the power amplifier circuit 100 was 500 mA. As the input voltage swing approaches extremes of either polarity, the transconductance gain of the power amplifier circuit 100 starts to fall, which corresponds to increasing signal distortion at such extremes of input voltage swing. However, as can be seen from the example of the plot 202, the Gm shapes can be flattened by using increasing amounts of gain degeneration (e.g., by providing larger-valued gain degeneration resistors R1a and R1b). This transconductance gain flattening can provide reduced signal distortion at such input voltage swing extremes, but at expense of reduced transconductance gain. Further, the power amplifier circuit 100 can only provide transconductance gain within a limited range of input voltage, which depends on the amount of bias current applied to the power amplifier circuit 100.

FIG. 3 shows an example of providing dynamically varying active gain degeneration in a differential power amplifier circuit, a portion of which is illustrated (for conceptual clarity and simplicity) for a single leg 300 of the pair of legs in the differential configuration of the corresponding power amplifier circuit 100 of FIGS. 1-2, with the understanding that the other leg of a differential amplifier can be similarly configured. For example, the input transistor Q1a in the power amplifier circuit 100 of FIGS. 1-2 can correspond to the Darlington pair of transistors Q1, Q2 of FIG. 3, in which the collectors of Q1 and Q2 can be connected to each other to provide a combined output current Iout, which can correspond to the current Iain the power amplifier circuit 100 of FIGS. 1-2. The base of the transistor Q1 can be connected to receive an input signal Vin, such as can be applied differentially across two legs of a differentially configured circuit, of which the single leg 300 is shown in FIG. 3. The emitter of the transistor Q1 can be connected to and can drive the base of the transistor Q2. The gain degeneration resistor R1a of the power amplifier circuit 100 of FIGS. 1-2 can correspond to the series combination of the gain degeneration resistors R1 and R2 in FIG. 3, with R1 receiving only the emitter current of Q1, and R2 receiving the emitter currents of both Q1 and Q2.

In FIG. 3, a differential power amplifier circuit including the single leg 300 can achieve dynamically varying gain degeneration, which can offer valuable latitude in increasing the useful range of low distortion operation, thereby increasing the input voltage swing that can be accommodated. For an input voltage at low level operation, the circuit 300 can function similar to Q1a of FIGS. 1-2, with a low current through R1 such that the base-emitter voltage of the transistor Q2 is very small, such that Q2 is either off or barely on. As the input voltage signal level is increased, Q2 will turn on more strongly and push current into R2, thereby raising the voltage across R2, which effectively makes the R2 component of the series gain degeneration resistance of R1 in series with R2 appear to Q1 be a larger resistor than it really is according to its physical resistance value.

Thus, in FIG. 3, as the input voltage signal level increases, the level of gain degeneration seen by Q1 increases. This can effectively provide a dynamically adjusted transition between the curves illustrated in the calculated plot 202 of FIG. 2. An appropriate selection of resistance values of R1 and R2 and native transconductances of the transistors Q1, Q2 of FIG. 3 can increase the useful dynamic range of the circuit 300 without requiring an increase in bias current to the circuit 300. The turn on action of the transistor Q2 tends to increase the effective gain degeneration seen by the transistor Q1, which can be conceptualized as reducing the transconductance gain of the transistor Q1. However, at the same time Q2 is now starting to turn on and starting to contribute its own native transconductance gain to the output, e.g., at the commonly connected collectors of the transistors Q1 and Q2. Depending on the component values chosen, the reduction in the effective transconductance of the transistor Q1 (e.g., due to the gain degeneration resistors R1 and R2) can be at least partially offset—or even more than merely offset—by the additional effective transconductance provided by the transistor Q2 when it turns on. For example, the increase in transconductance gain from the transistor Q2 can be specified so as to provide for a net increase in overall transconductance. Computer-aided simulation can be used, e.g., in addition or alternative to theoretical calculations to specify component values, such as to specify or optimize this transconductance gain extension, such as to suit one or more particular requirements.

Thus, in the example of FIG. 3, the circuit 300 can operate in a hybrid of at least two modes. The transistor Q1 can operate in Class A mode, such as in which Q1 is always on, while the Q2 can be configured to selectively operate in a range of multiple possible modes. For example, if the transistor Q2 is always on but operates with varying bias current depending on input signal strength received via the transistor Q1, then the transistor Q2 can be operating in Class AB mode. If the transistor Q2 is on for some portion that is less than 100% of the operating cycle, then the transistor Q2 can be operating in Class B mode or in Class C mode. In either case, a hybrid-mode differential amplifier using a pair of the single legs 300 of FIG. 3 is not purely a Class A structure, with the efficiency limitations noted above. The transistor Q2 can be activated only when the input signal condition warrants, e.g., for larger input voltage swings, such as those that exceed a specified threshold value around which the amplifier can be configured. This can provide the ability to improve overall power efficiency. Hence, an amplifier having a portion configured such as shown in FIG. 3 can provide both a linearity improvement along with an improvement in power efficiency.

In FIG. 3, the resistor R2 shown can also advantageously play another role in an amplifier circuit in accordance with the present subject matter. The current flowing through R2 contains the distortion artifacts associated with the primary non-linear mechanism of the transistors Q1 and Q2. Their exponential voltage-to-current conversion is extremely non-linear and, therefore, can dominate the distortion performance of the resulting amplifier circuit. As such the voltage signal across the resistor R2 can provide valuable information that can be useful, such as for a subsequent feedback linearization scheme.

FIG. 4 shows an example of providing dynamically varying active gain degeneration in a differential power amplifier circuit, a portion of which is illustrated (for conceptual clarity and simplicity) for a single leg 400 of the pair of legs in the differential configuration of the corresponding power amplifier circuit 100 of FIGS. 1-2, with the understanding that the other leg of a differential power amplifier circuit can be similarly configured.

The circuit in FIG. 4 can take the approach of FIG. 3 further, such as by adding transistor devices Q2b and Q2c to each single leg 400 of the pair of legs in the differential configuration of a power amplifier circuit. In principle, the circuit in FIG. 4 can be extended to as many transistor devices and active gain degeneration and gain expansion sections as desired, such as by replicating n times the extension of Q2a, Q2b, Q2c, . . . , to Q2n, where n is a specified positive integer.

For example, in FIG. 4, the collectors of the transistors Q1, Q2a, Q2b, and Q2c can be commonly connected to each other to provide a combined output current Iout, which can correspond to the current Ia in the power amplifier circuit 100 of FIGS. 1-2. The base of the transistor Q1 can be connected to receive an input signal Vin, such as can be applied differentially across two legs of a differentially configured power amplifier circuit, of which the single leg 400 is shown in FIG. 4. The emitter of the transistor Q1 can be connected to and can drive the base of the transistor Q2a. The gain degeneration resistor R1a of the power amplifier circuit 100 of FIGS. 1-2 can correspond to the series combination of the gain degeneration resistors R1a, R1b, R1c, and R2 in FIG. 4, with R1a, R1b, and R1c receiving only the emitter current of Q1, and R2 receiving the emitter currents of Q1, Q2a, Q2b, and Q2c. Similarly, the emitter of the transistor Q1 can be connected to and can drive the bases of Q2b (e.g., via resistor R1a) and Q2c (e.g., via the series combination of the resistors R1a and R1b). Each active gain degeneration and gain expansion section can include a transistor (e.g., Q2a, Q2b, Q2c) having an emitter coupled via a corresponding resistor (e.g., R3a, R3b, R1c) to a node between the gain degeneration resistor R2 and the series combination gain resistor formed by R1a, R1b, and R1c in series.

The resistors R3a, R3b, and R3c are available to help control the transconductance gain expansion provided by their respective active gain degeneration and gain expansion circuits once their corresponding transistor devices start to turn on. Using computer-aided optimization for the values of resistances and transistor device sizes (e.g., base-emitter junction areas), it is possible to construct overall (e.g., combined from Q1, Q2a, Q2b, Q2c, . . ., , Q2n) composite transconductance responses, which can provide composite transconductance gain expansion with increasing input voltage. Moreover, as similarly explained above, the voltage across the resistor R2 includes information about the dominant distortion mechanisms in Q1, Q2a, Q2b, . . ., Q2n. As such the voltage signal across the resistor R2 can provide valuable information that can be useful, such as for a subsequent feedback linearization scheme.

FIG. 5 shows an example of a single-ended, single-stage common emitter (CE) power amplifier circuit 500 built to illustrate the principles illustrated by the circuit shown in FIG. 3. In the example shown in FIG. 5, commercially available silicon npn bipolar junction transistor devices Q1 and Q2 were used (e.g., Avago AT64000). R1 and R2 were chosen with specified resistance values (e.g., R1=4.25 Ohms, R2=5.06 Ohms) to turn on Q2 appropriately as the input voltage signal level is increased. A resistive attenuator network (e.g., including shunt resistor R4=23 Ohms and series resistor R5=40 Ohms) was applied on the output, such as via a series output capacitor (e.g., 33000 pF) such as to lower the impedance seen by the power amplifier circuit 500, such as to isolate current-related distortion terms from collector capacitance terms. The common collectors of transistors Q1 and Q2 were inductively coupled (e.g., via a 4000 nH inductor) to a bias voltage (e.g., 12 Volts), such as shown in FIG. 5. The base of transistor Q1 was inductively coupled (e.g., via a 4000 nH inductor) to a bias voltage (e.g., 1.68 Volts).

FIG. 6 shows a resulting measurement of a gain compression plot for the power amplifier circuit 500 shown in FIG. 5. In FIG. 6, the input power (in dB) is swept as shown by the x-axis and the measured amplifier gain (in dB) is plotted on the y-axis. As shown in FIG. 6, as the input signal power increases, the composite gain of the amplifier 500 eventually compresses, which is indicated by a drop in gain. In this example, the DC bias current of Q1 and the resistance value provided by R1 can be used to develop a DC voltage across the base-emitter junction of the transistor Q2, such as for causing the transistor Q2 to be operated in a Class C mode.

FIG. 6 shows one trace (dashed line) demonstrating the gain response without including the transistor Q2, and another trace (solid line) demonstrating the effect of including the transistor Q2. From the result example shown in FIG. 6, it is clear that at or above the power level at which the gain has reduced an arbitrarily small amount, for example 1 dB, the gain response is improved with the inclusion of the transistor Q2. Also, because the transistor Q2 only draws current when it is needed, the net power amplifier efficiency is improved. The inclusion of the transistor Q2 does increase the DC current drawn from the power supply, but the increase is less than the increase that would have been needed to achieve the same result using a purely Class A approach in which the transistor device or devices are always on.

FIG. 7 shows an example of a differential, push-pull, or other dual-portion power amplifier circuit 700, which can include a left ("L") half circuit 702L and a right ("R") half circuit 702R. Such a circuit configuration can he used to provide an extended operating range using the power amplifier circuit 700, such as explained above. The power amplifier circuit 700 can make use of the principles, components, and techniques described herein, such as for providing active gain degeneration together with auxiliary device gain enhancement, such as to manipulate the transconductance gain of each half circuit 702L, 702R, such that the combined transconductance gain response can remain constant over a wider input voltage signal swing.

For example, when the input signal drive level is increased to a level at which all or a portion of one half circuit 702L, 702R of the amplifier circuit 700 is starting to turn off, the combined differential transconductance (which can be represented by the sum of the individual half circuit transconductances) can be maintained constant by increasing the transconductance of the opposite half circuit 702L, 702R of the amplifier circuit 700 by an equal amount. In that way, each half circuit side can make up for a deficient gain of the opposite half circuit side. This document describes examples of certain circuit topologies and synthesis approaches that can be used to configure push-pull amplifiers, such as for achieving improved efficiencies using this complementary approach.

In FIG. 7, the differential output signal is given by (Iout_L−Iout_R) keeping in mind that the input signals (Vin_L, Vin_R) to each respective half circuit (702L, 702R) are inverted with respect to the other, such that the differential output signal is additive in magnitude. in FIG. 7, input buffer stages Qbuf_L and Qbuf_R (with respective emitters connected to corresponding resistors, Rbuf_L and Rbuf_R) can optionally be included, such as to provide impedance buffering, which can make operation of Q1_L and Q1_R less dependent on any source impedance complications. Furthermore, these buffer devices Qbuf_L and Qbuf_R can help better drive the base-emitter capacitances of Q1_L and Q1_R, which can improve the frequency response of the amplifier circuit 700. A Darlington structure can be provided by the transistors Qbuf_R with Q1_R, or Qbuf_L with Q1_L.

In the example of FIG. 7, the ground nodes of the half-circuits 702L and 702R can optionally be replaced by an intermediate node that can be connected to a shared ground node via a series resistor or current source, such as to provide a differential pair amplifier configuration. Further, in such an optional configuration, the input signal to one of the half-circuits 702L and 702R can optionally be biased at an appropriate fixed reference voltage, such as to provide differential pair amplifier operation. Similar techniques can be applied to FIGS. 8-9, discussed below.

FIG. 8 shows an example of a differential power amplifier circuit 800 that is modified from the example of the differential power amplifier circuit 700 shown in FIG. 7. In the differential power amplifier circuit 800 of FIG. 8, the buffer transistor devices Qbuf_L and Qbuf_R can be separately biased by connecting their collectors to a bias voltage, such as Vbuf, rather than to the respective output voltage nodes providing Iout_L and Iout_R as was shown in the example of FIG. 7.

In the differential power amplifier circuit 800 example shown in FIG. 8, biasing the buffer devices Qbuf_L and Qbuf_R with a separate supply Vbuf can help to achieve higher frequency bandwidth. In this case, any collector-to-base capacitance on the buffer devices Qbuf_L and Qbuf_R is not subject to Miller multiplication, which otherwise would reduce amplifier frequency bandwidth. In certain cases, the performance degradation associated with the loss of buffer device transconductive contribution to producing the currents at the output nodes can be more than offset by performance improvement due to the reduction in Miller effects in the buffer transistor devices, Qbuf_L and Qbuf_R. Furthermore, in the differential power amplifier circuit 800 example shown in FIG. 8, the voltage value provided by the bias voltage Vbuf can be less than whatever supply voltage is chosen for the main devices (e.g., Q1_L, Q2a_L, Q1_r, Q2a_R), which can lead to a potential improvement in power efficiency using the differential power amplifier circuit 800 configuration of FIG. 8, as compared to the differential power amplifier circuit 700 configuration of FIG. 7.

As noted with previous examples, computer-aided simulation and optimization can be employed, such as to help create or configure a power amplifier circuit for having a combined transconducta.nce response that can extend the useful range of operation beyond traditional Class A levels. At the same time, the linearity of the power amplifier circuit can be enhanced or optimized, such as for achieving performance comparable to that of a Class A configuration. Hence, the power amplifier circuit topologies according to the present subject matter can allow achievement of the best aspects of both classes. For low input levels, the power amplifier circuits according to the present subject matter described herein can behave as a Class A with associated good linearity. When the input signal is large, the power amplifier circuits according to the present subject matter described herein can automatically (e.g., without requiring a separate control signal) operate in a Class B mode or a Class C mode, such as to help achieve good power efficiency.

FIG. 9 shows an example of a modified power amplifier circuit 700 according to the present subject matter, such as can be applied in an example of a cable television broadband amplifier configuration 900. In this example, an input transformer circuit T1 can be included, such as to split a single-ended input signal Vin into separate differential components that can be applied as an input to the base of the left half-circuit buffer transistor device Qbuf_L and as another input to the base of the right half-circuit buffer transistor device Qbuf_R, respectively. The center tap of the secondary side of T1 can be connected to a DC bias voltage, such as Vbias. An output transformer T2 can be included, such as to combine the differential output signals into a single-ended output signal at the node Vout. The center tap of the primary side of the output transformer T2 can be connected to a DC bias voltage, such as to the supply voltage VDD, as shown in FIG. 9.

In FIG. 9, the left and right half-circuits can operate such as described above, with a modification that can optionally be provided, such as by including cascoding respective top-half field-effect transistors (FET) or other transistor devices Qtop_L and Qtop_R in series at the respective outputs of the bottom half collectors providing the output currents Iout_L and Iout_R as was shown in FIG. 7. In the example of FIG. 9, the cascoding top-half transistor devices Qtop_L and Qtop_R can have their gate inputs connected to a DC bias voltage, such as Vgate. The top half transistor devices Qtop_L and Qtop_R can help shield the bottom halves (e.g., including Qbuf_I Qbuf_R, Q1_L, Q1_R, Q2_L, and Q2_R) from wide output voltage swings, such as may be present at the primary side of the output transformer T2.

The output transformer T2 can help provide for useful manipulation of impedances such that the top half output transistor devices Qtop_L and Qtop_R see a suitable or optimum impedance such as for increasing or maximizing power transfer at their particular bias voltages and currents. For example, the core power amplifier circuit 700 can operate such as previously described with respect to FIG. 7, such as with the buffer transistor devices Qbuf_L and Qbuf_R receiving their differential input signals from the secondary side of the input transformer T1 and respectively driving Q1_L and Q1_R. A DC bias voltage reference circuit, such as Vbias, can set the quiescent currents through R1_L and R1_R, such that Q2_ L and. Q2_R start conducting current through the top half and into the output as desired, such as to hold amplifier voltage gain constant, such as over a wide input signal voltage range.

In this example, the supply voltage VDD can serve as the primary power supply and, in an example, can provide a voltage of value 24 volts, In an example, the quiescent bias current can be set to 450 mA, such as with a resulting nominal power consumption of 10.9 Watts. This biasing arrangement and level is compatible with the majority of cable television system output stages of other approaches. The top devices Qtop_L and Qtop_R can be selected to accommodate a desired frequency bandwidth. For a cable television application, Gallium Nitride (GaN) FETs can be used, such as for their ability to withstand high voltages, while providing reasonable frequency bandwidth, The bottom half components can include bipolar transistors, such as can include attributes such as high bandwidth for minimized capacitances. In an example in accordance with FIG. 9, the bottom half components can include heterojunction bipolar transistors (HBTs), such as for their wide frequency bandwidth and consistent transconductance linearity. The various examples of power amplifier circuits according to the present subject matter described herein may include FET devices in the bottom half or bipolar devices in the top half, if desired. In an example, the input transformer T1 can provide a 1-to-1 impedance ratio, and the secondary center tap can be biased by a desired bias voltage circuit, such as Vbias, which can be used to set the quiescent current, as explained herein. In an example, the output transformer T2 impedance ratio was configured to 1.4-to-1, which can be accomplished with suitable winding configurations and ratios. Broadband port impedances can be set by these transformer winding ratios and by the levels of series feedback, shunt feedback, or both, Series feedback can be set by considerations for good active gain degeneration, such as using the resistance values of the resistors R1_L and R1_R, R2_L and R2_R. The resistance value selection of the shunt feedback resistors RFB_L and RFB_R in the top half shown in FIG. 9 can then serve as a primary way for setting port impedances to a desired value.

FIGS. 10, 11, and 12 show examples of computer simulation results of the circuit configuration 900 shown in FIG. 9, such as was simulated at 1.4 GHz using fully developed HBT models and genetic GaN models. By simulating both with the active degeneration devices Q2_L and Q2_R connected and disconnected, the improvement provided by using the configuration 900 shown in FIG. 9 including the active degeneration devices Q2_L and Q2_R can be seen.

FIG. 10 shows a computer simulation result plot of the DC power consumption (in Watts) as the input signal level is increased to produce the RF output power level (in dBm) used as the x-axis in the plot. The results shown in FIG. 10 exhibit very small increase in power consumption using the circuit shown in FIG. 9 in accordance with an example of the present subject matter.

FIG. 11 shows a computer simulation result plot of gain magnitude (in dB) vs. fundamental RF output power (in dBm), both with and without the active gain degeneration and gain enhancement that can be provided by the present subject matter, such as by using the circuit configuration 900 shown in FIG. 9.

FIG. 12 shows a computer simulation result plot of gain phase response (in relative degrees between input and output) vs. fundamental RF output power (in dBm), both with and without the active gain degeneration and gain enhancement that can be provided by the present subject matter, such as by using the circuit configuration 900 shown in FIG. 9.

Both FIG. 11 and FIG. 12 show a clear improvement in power handling capability using the present approach, such as shown in the example of FIG. 9. The improvement in output power capability more than offsets the small increase in DC power consumption, making the present approach very efficient for addressing the problems at hand, such as explained herein.

As many communication systems evolve today, such as may use heightened levels of modulation and encoding sophistication, the amount of gain distortion tolerable in distribution amplifiers may decrease. For example, for certain quadrature amplitude modulated (QAM) system approaches, such as can be used in DOCSIS 3.1 (Data Over Cable System Interface Specification), the signal may be modulated into as many as 4096 discrete levels, and it is possible that this approach may be extended even further, such as by going even to 16384 discrete levels. To prevent the system from confusing these discrete signal levels, gain deviations of less than 0.1 dB may be needed, as the signal level traverses its operating range, The computer simulation results of FIG. 11 demonstrate that the present approach can extend the useful output power by approximately 3.5 dB.

The particulars of signal encoding of certain approaches can also generate a high ratio of peak signal to average signal. That is, the peak excursion of the signal with time can often be much higher than the average level. Even though these signal peak occurrences can be very rare, if not properly accounted for, amplifiers may cause meaningful loss of data traffic and, in a cable television application, undesirable picture impairments. The techniques of the present approach can help addresses this challenge, such as by providing for automatic adjustment of the amplifier circuit bias current, for example, to increase the amplifier circuit bias current automatically in response to excursions of the input signal amplitude beyond one or more specified threshold values, thereby increasing the amplifier circuit operating range without requiring a separate control signal beyond the input signal amplitude itself.

Analysis and evaluation of the example of FIG. 9 demonstrates that, although efficiency improvements are available, operation may be sensitive to expected manufacturing tolerances and environment. Unless such considerations are addressed, bias currents may vary over temperature and resistor tolerances, which, in many integrated circuit fabrication processes, can be in the neighborhood of 5%.

FIG. 13 shows an example of a portion of a power amplifier circuit 1300 that can help address such variability concerns. In FIG. 13, an additional preamplifier circuit stage ("A") can be located in the input signal path before the dynamic active gain degeneration and enhancement circuit of Qbuf, Q1, Q2, R1, R2, and R3, and feedback taken from the voltage across R2 (e.g., via feedback resistor, Re_FB) can be applied to the input of the preamplifier A. As explained herein, the voltage signal across R2 can provide information about resulting non-linear currents created by the transistor devices Qbuf, Q1, and Q2. A closed-loop feedback system, such as using the feedback resistor, Re_FB, and additional forward gain provided by the preamplifier A can help further linearize the transconductance gain function of the circuit. For example, when circuit component or process tolerances or environmental conditions cause small misalignments of the transconductance gain, the high loop gain of the feedback circuit included in FIG. 13 can help automatically reduce their impact on the overall transconductance gain function of the dynamic active gain degeneration and enhancement circuit, such as when used in a power amplifier circuit. For the circuit example shown in FIG. 13, the gain of the preamplifier stage A can be configured as an inverting gain stage, such as to preserve overall negative feedback. There are various possible circuit configurations that can be used to implement the feedback circuit principles introduced in FIG. 13.

FIG. 14 shows an example of a possible circuit configuration 1400 that can be used to implement the feedback circuit principles shown in and described with respect to FIG. 13. In the illustrative example of FIG. 14, an amplifier stage can include a transistor, Qa, which can serve as the amplifier, A, of FIG. 13. In an example, the transistor Qa can include a base coupled to receive an input signal and the feedback signal through Re_FB. The transistor Qa can include an emitter coupled to a reference node, such as ground, by a resistor Ra. The collector of the transistor Qa can be coupled to the base of the transistor Qa via a resistor Rb, and inductively coupled to a bias voltage, such as shown in FIG. 14. The increased forward gain can provide valuable flexibility or design margin to increase the net gain of the overall power amplifier circuit in which it is used, and can also help achieve high loop gain for feedback linearization. A level shifter circuit (e.g., one or more series-connected or otherwise configured diodes or diode-connected transistors, or a capacitively bypassed resistor ladder) can be used between the collector of the transistor Qa and the base terminal input of the buffer transistor Qbuf such as to translate a dc signal level, such as to provide an appropriate operating point and quiescent currents for the dynamic active gain degeneration and enhancement circuitry.

To review, the present subject matter can include blending of multiple classes of amplification in a topology that can lend itself to optimization or implementation for volume manufacturing. An active gain degeneration and enhancement technique can extend the useful input range of a power amplifier circuit, such as by dynamically manipulating series feedback using one or more active devices such as transistors, and may be implemented or optimized with the assistance of one or more computer-aided techniques. The various embodiments described herein, or one or more combinations of one or more portions thereof, can lend itself to integration within a single integrated circuit, if desired. Furthermore, limitations of the active gain degeneration technique can be mitigated, such as through use of one or more feedback topologies in which one or more additional gain stages can be used, such as to maximize loop gain. Feedback around such high loop gain stages can desensitize the closed-loop response, such as to one or more naturally occurring variations, such as can occur with volume manufacturing, with environmental parameter (e.g., temperature) change, or both. The result is an a power amplifier circuit that can provide excellent manufacturability, and that can also achieve the desirable linearity of Class A and that of other more efficient classes.

FIG. 15 shows an example of another possible circuit implementation such as can use a similar high loop gain principle, such as can help to mitigate otherwise possible misalignment of the active gain degeneration. In the example of FIG. 15, a high gain triplet topology can be formed with transistor devices Qa, Qb, and the active gain degeneration pair of transistors, Q1 and Q2. The additional stage in the preamplification can help provide another boost in forward loop gain, such as can help to stabilize circuit performance. As noted, the additional stage or stages can also help increase flexibility and design margin, such as by enabling extremely high gain, which can be useful in increasing efficiency, since these additional preamplifier stages can be biased for lower output.

It should be pointed out that the topologies shown in FIGS. 13, 14, and 15 are also useful in one or more push-pull implementations, such as in any of those shown in FIGS. 7, 8, and 9. In the push-pull implementations, it can be useful to construct feedback paths that contain an opposite polarity found in the opposing stage. By making one or more nodes (or each node) available to the opposite half, for example, for feedback, biasing, or both, design and operational flexibility can be increased.

FIG. 16 shows and example of a second harmonic trap circuit 1600, which can be included in or used in combination with one or any of the single-ended or push-pull power amplifier circuit configurations such as described herein. For example, the second harmonic trap circuit 1600 can be placed across the power amplifier circuit outputs, such as shown in FIG. 16. This trap may be implemented in a narrowband case by including an first order (or higher-order) active or passive inductor-capacitor (LC) filter circuit 1602, such as to short out or otherwise attenuate a higher order harmonic, such as a second harmonics, such as at or near a specified expected frequency of the harmonic to be attenuated. A wider bandwidth approach can involve additionally or alternatively including a balun transformer T3, such as can serve as a common-mode trap thereby shorting even-mode distortion terms. In this case, voltages that appear in common on each output will be shorted by the balun T3 shown in FIG. 16. The balun T3 can also be used to introduce voltage bias, such as shown in FIG. 16.

Various Notes

The above description includes references to the accompanying drawings, which form a part of the detailed description. The drawings show, by way of illustration, specific embodiments in which the invention can be practiced. These embodiments are also referred to herein as "examples," Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A power amplifier circuit for broadband data communication over a path in a communication network, the power amplifier circuit comprising:
   a first amplifier stage, comprising circuitry including:
      a first transistor, having a signal input node to receive a data signal voltage to be converted by the first transistor into a current to contribute to an output signal current to be provided at a signal output node; and
      a first gain degeneration resistor, coupled to the first transistor and configured to receive a representation of a component of the output signal current provided by the first transistor; and
   at least one second amplifier stage, comprising circuitry including:
      a second transistor, coupled to the first transistor to receive an input voltage based on the data signal voltage, and configured to turn on at a larger amplitude of the data signal voltage relative to a smaller amplitude of the data signal voltage to (1) to provide current to at least a portion of the first gain degeneration resistor to increase an effective gain degeneration resistance of the first gain degeneration resistor seen by the first transistor, to reduce a transconductance or other gain of the first transistor; and (2) contribute current to the output signal current to help maintain or enhance an overall gain between the signal input node and the signal output node.

2. The power amplifier circuit of claim 1, wherein the first gain degeneration resistor includes:
   a first resistance component, arranged to provide a control voltage to turn on the second transistor; and
   a second resistance component, arranged to receive current from the second transistor to increase an effective resistance of the second resistance component to reduce the gain of the first transistor.

3. The power amplifier circuit of claim 2, including N second amplifier stages respectively including a corresponding second transistor, wherein N is an integer greater than or equal to two, and wherein the first gain degeneration resistor includes:
   N first resistance components, providing respective control voltages to turn on the corresponding second transistor of a respective one of the N second amplifier stages; and
   wherein the second resistance component is arranged to receive current from at least two of the second transistors of corresponding second amplifier stages.

4. The power amplifier circuit of claim 3, wherein the second resistance component is arranged to receive current from at least two of the second transistors of corresponding second. amplifier stages via respective resistors having resistance values for operating respective second transistors in the corresponding second amplifier stages for contributing respective currents to the output signal current to help maintain or enhance an overall gain between the signal input node and the signal output node.

5. The power amplifier circuit of claim 1, wherein the first amplifier stage is preceded by a buffer circuit stage in the signal path to receive a pre-buffered data signal voltage and to provide a resulting buffered data signal voltage as the data signal voltage at the signal input node of the first amplifier stage.

6. The power amplifier circuit of claim 5, wherein the buffer circuit stage is arranged to provide a current that does not flow through the first gain degeneration resistor.

7. The power amplifier of claim 5, wherein the buffer circuit stage is arranged to provide a current that flows through at least a portion of the first gain degeneration resistor.

8. The power amplifier circuit of claim 5, wherein the buffer circuit stage is connected to a separate biasing circuit so as not contribute to the output signal current at the signal output node.

9. The power amplifier circuit of claim 1, comprising a dual portion circuit arrangement including an "L" circuit portion and an "R" circuit portion, each including a corresponding first amplifier stage and a corresponding at least one second amplifier stage, and arranged to receive a respective input voltage at respective "L" and "R" ones of the signal input node and to provide a respective signal output at respective "L" and "R" ones of the signal output node.

10. The power amplifier circuit of claim 9, wherein the first amplifier stage is preceded by a buffer circuit stage in the signal path to receive a pre-buffered data signal voltage and to provide a resulting buffered data signal voltage as the data signal voltage at the signal input node of the first amplifier stage, wherein the buffer circuit stage in the L circuit portion is connected to the buffer circuit stage in the R circuit portion and does not contribute to the output signal current at respective "L" and "R" ones the signal output node.

11. The power amplifier circuit of claim 9, comprising:
an input transformer, configured to receive a single-ended input signal and to provide the respective input voltage at the respective L and R ones of the signal input node; and
an output transformer, configured to receive the respective signal output at respective L and R ones of the signal output node and to provide a resulting single-ended output signal.

12. The power amplifier circuit of claim 9, comprising respective field-effect or other transistor cascode devices through which respective output signal currents pass, wherein the cascode devices respectively include a control terminal configured to receive a fixed bias voltage.

13. The power amplifier circuit of claim 2, comprising a feedback signal taken from the second resistance component, provided with a gain as negative feedback to modify the data signal voltage to be received by the first amplifier stage at the signal input node.

14. The power amplifier circuit of claim 9, comprising, across the respective L and R ones of the signal output node, a notch or lowpass frequency-selective filter circuit to attenuate or reject a common-mode signal.

15. The power amplifier circuit of claim 9, comprising, across the respective L and R ones of the signal output note, a balun, including a center tap configured to receive a fixed bias voltage.

16. An amplifier method for broadband data communication over a path in a communication network, the method comprising:
converting a data signal voltage at a signal input node to an output signal current to be provided at a signal output node, using a first transistor device operable to contribute to the output signal current; and
converting a signal based on the data signal voltage at the signal input node into a current, using a second transistor device, to be provided, separate from a current provided by the first transistor, to reduce a transconductance or other gain of the first transistor, and to contribute to the output signal current to help maintain or enhance an overall gain between the signal input node and the signal output node.

17. The method of claim 16, comprising:
providing current from the first transistor device to a first resistance component of a first gain degeneration resistor to turn on the second transistor at a larger amplitude of the data signal voltage relative to a smaller amplitude of the data signal voltage; and
providing current from the first transistor device and from the second transistor device to a second component of the first gain degeneration resistor, wherein the providing current from the second transistor device to the second component of the first gain degeneration resistor to increase an effective resistance of the second resistance component to reduce the gain of the first transistor.

18. The method of claim 17, comprising:
taking a feedback signal from the second resistance component; and
providing the feedback signal with gain as negative feedback to modify the data signal voltage to be received by the first amplifier stage at the signal input node.

19. The method of claim 16, comprising:
receiving the data signal voltage as a differential or push-pull input signal;
providing a resulting differential or push-pull output signal; and
attenuating a common-mode component of the output signal.

20. A power amplifier circuit for broadband data communication over a path in a communication network, the power amplifier circuit comprising:
means for converting a data signal voltage at a signal input node to an output signal current to be provided at a signal output node, using a first transistor device operable to contribute to the output signal current; and
means for converting a signal based on the data signal voltage at the signal input node into a current, using a second transistor device, to be provided, separate from a current provided by the first transistor to reduce a transconductance or other gain of the first transistor, and to contribute to the output signal current to help maintain or enhance an overall gain between the signal input node and the signal output node.

21. A power amplifier circuit for broadband data communication over a path in a communication network, the power amplifier circuit comprising:
a first amplifier stage, comprising circuitry including:
a first transistor, having a signal input node to receive a data signal voltage to be converted by the first transistor into a current to contribute to an output signal current to be provided at a signal output node; and.
a first gain degeneration resistor, coupled to the first transistor and configured to receive a representation of a component of the output signal current provided by the first transistor; and
at least one second amplifier stage, comprising circuitry including:
a second transistor, coupled to the first transistor to receive an input voltage based on the data signal voltage, and configured to turn on at a larger amplitude of the data signal voltage relative to a smaller amplitude of the data signal voltage to (1) to provide current to at least a portion of the first gain degeneration resistor to reduce a transconductance or other gain of the first transistor; and (2) contribute current to the output signal current to help maintain or enhance an overall gain between the signal input node and the signal output node; and
wherein the first gain degeneration resistor includes:
a first resistance component, arranged to provide a control voltage to turn on the second transistor; and
a second resistance component, arranged to receive current from the second transistor to increase an effective resistance of the second resistance component to reduce the gain of the first transistor.

22. A power amplifier circuit for broadband data communication over a path in a. communication network, the power amplifier circuit comprising:
- a first amplifier stage, comprising circuitry including:
  - a first transistor, having a signal input node to receive a data signal voltage to be converted by the first transistor into a current to contribute to an output signal current to be provided at a signal output node; and.
  - a first gain degeneration resistor, coupled to the first transistor and configured to receive a representation of a component of the output signal current provided by the first transistor; and
- at least one second amplifier stage, comprising circuitry including:
  - a second transistor, coupled to the first transistor to receive an input voltage based on the data signal voltage, and configured to turn on at a larger amplitude of the data signal voltage relative to a smaller amplitude of the data signal voltage to (1) to provide current, separately from current provided by the first transistor, to at least a portion of the first gain degeneration resistor to reduce a transconductance or other gain of the first transistor; and (2) contribute current to the output signal current to help maintain or enhance an overall gain between the signal input node and the signal output node.

23. The power amplifier circuit of claim 20, comprising:
means for providing current from the first transistor device to a first resistance component of a first gain degeneration resistor to turn on the second transistor at a larger amplitude of the data signal voltage relative to a smaller amplitude of the data signal voltage; and
means for providing current from the first transistor device and from the second transistor device to a second component of the first gain degeneration resistor, wherein the providing current from the second transistor device to the second component of the first gain degeneration resistor to increase an effective resistance of the second resistance component to reduce the gain of the first transistor.

24. The power amplifier circuit of claim 21, comprising a feedback signal taken from the second resistance component, provided with a gain as negative feedback to modify the data signal voltage to be received by the first amplifier stage at the signal input node.

25. The power amplifier circuit of claim 22, wherein the first gain degeneration resistor includes:
- a first resistance component, arranged to provide a control voltage to turn on the second transistor; and
- a second resistance component, arranged to receive current from the second transistor to increase an effective resistance of the second resistance component to reduce the gain of the first transistor.

26. The power amplifier circuit of claim 25, comprising a feedback signal taken from the second resistance component, provided with a gain as negative feedback to modify the data signal voltage to be received by the first amplifier stage at the signal input node.

* * * * *

UNITED STATES PATENT AND TRADEMARK OFFICE
CERTIFICATE OF CORRECTION

PATENT NO. : 10,177,717 B2
APPLICATION NO. : 15/457431
DATED : January 8, 2019
INVENTOR(S) : Day et al.

Page 1 of 1

It is certified that error appears in the above-identified patent and that said Letters Patent is hereby corrected as shown below:

In the Claims

In Column 18, Line 39, in Claim 4, delete "second." and insert --second-- therefor
In Column 20, Line 29, in Claim 20, delete "transistor" and insert --transistor,-- therefor
In Column 20, Line 43, in Claim 21, delete "and." and insert --and-- therefor
In Column 21, Line 2, in Claim 22, delete "a." and insert --a-- therefor
In Column 21, Line 9, in Claim 22, delete "and." and insert --and-- therefor Signed and Sealed this
Twenty-eighth Day of April, 2020

Andrei Iancu
*Director of the United States Patent and Trademark Office*